United States Patent
Young et al.

(10) Patent No.: US 6,760,899 B1
(45) Date of Patent: Jul. 6, 2004

(54) DEDICATED RESOURCE PLACEMENT ENHANCEMENT

(75) Inventors: Jay T. Young, Louisville, CO (US); Salim Abid, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/215,978

(22) Filed: Aug. 8, 2002

(51) Int. Cl.[7] .............................................. G06F 17/50
(52) U.S. Cl. ............................... 716/16; 716/8; 716/10
(58) Field of Search ............................ 716/7, 8, 9, 16, 716/10, 11, 12, 13, 14, 15, 17, 18, 19

(56) References Cited

U.S. PATENT DOCUMENTS

| | | | | |
|---|---|---|---|---|
| 5,619,419 A | * | 4/1997 | D'Haeseleer et al. | .......... 716/8 |
| 5,889,413 A | | 3/1999 | Bauer | |
| 6,118,298 A | | 9/2000 | Bauer et al. | |
| 6,155,725 A | * | 12/2000 | Scepanovic et al. | ........... 716/9 |
| 6,240,541 B1 | * | 5/2001 | Yasuda et al. | .................. 716/6 |
| 6,243,851 B1 | * | 6/2001 | Hwang et al. | ................ 716/10 |
| 6,249,902 B1 | * | 6/2001 | Igusa et al. | .................... 716/10 |
| 6,262,597 B1 | | 7/2001 | Bauer et al. | |

* cited by examiner

*Primary Examiner*—Vuthe Siek
*Assistant Examiner*—Binh C. Tat
(74) *Attorney, Agent, or Firm*—W. Eric Webostad

(57) ABSTRACT

Method and code for dedicated resource placement enhancement is described. More particularly, a local area of a network is obtained for determining placement options of logic blocks to increase availability of dedicated resources within the local area. Each placement option is scored. This scoring may be based in part on whether a signal is to be propagated over a dedicated resource, and whether this signal is presently meeting a slack or target delay. Logic blocks, and therefore the dedicated resources, are placed after scoring.

16 Claims, 6 Drawing Sheets

CLB 100

| Driver Slice | Output Pin | Load Slice | Input Pin | Approx. Delay (ps) |
|---|---|---|---|---|
| S0 | X0 | S0 | F1 | 217 |
| S0 | X0 | S0 | G1 | 249 |
| S0 | X0 | S1 | F4 | 2 |
| S0 | X0 | S1 | G4 | 36 |
| S0 | X0 | S2 | F1 | 217 |
| S0 | X0 | S2 | G1 | 249 |
| S0 | X0 | S3 | F4 | 2 |
| S0 | X0 | S3 | G4 | 36 |
| S0 | Y0 | S0 | F4 | 2 |
| S0 | Y0 | S1 | F1 | 217 |
| S0 | Y0 | S1 | G1 | 249 |
| S0 | Y0 | S2 | F4 | 2 |
| S0 | Y0 | S2 | G4 | 36 |
| S0 | Y0 | S3 | F1 | 217 |
| S0 | Y0 | S3 | G1 | 249 |
| S1 | X1 | S0 | F3 | 31 |
| S1 | X1 | S1 | G3 | 4 |
| S1 | X1 | S1 | F2 | 182 |
| S1 | X1 | S2 | G2 | 157 |
| S1 | X1 | S2 | F3 | 31 |
| S1 | X1 | S3 | G3 | 4 |
| S1 | Y1 | S0 | F2 | 182 |
| S1 | Y1 | S1 | G2 | 157 |
| S1 | Y1 | S1 | F2 | 182 |
| S1 | Y1 | S2 | G2 | 157 |
| S1 | Y1 | S2 | F3 | 31 |
| S1 | Y1 | S3 | G3 | 4 |

| Driver Slice | Output Pin | Load Slice | Input Pin | Approx. Delay (ps) |
|---|---|---|---|---|
| S2 | X2 | S0 | F2 | 182 |
| S2 | X2 | S0 | G2 | 157 |
| S2 | X2 | S1 | F3 | 31 |
| S2 | X2 | S1 | G3 | 4 |
| S2 | X2 | S2 | F2 | 182 |
| S2 | X2 | S2 | G2 | 157 |
| S2 | X2 | S3 | F3 | 31 |
| S2 | X2 | S3 | G3 | 4 |
| S2 | Y2 | S0 | F3 | 31 |
| S2 | Y2 | S0 | G3 | 4 |
| S2 | Y2 | S1 | F2 | 182 |
| S2 | Y2 | S1 | G2 | 157 |
| S2 | Y2 | S2 | F3 | 31 |
| S2 | Y2 | S2 | G3 | 4 |
| S2 | Y2 | S3 | F2 | 182 |
| S2 | Y2 | S3 | G2 | 157 |
| S3 | X3 | S0 | F4 | 2 |
| S3 | X3 | S0 | G4 | 36 |
| S3 | X3 | S1 | F1 | 217 |
| S3 | X3 | S1 | G1 | 249 |
| S3 | X3 | S2 | F4 | 2 |
| S3 | X3 | S2 | G4 | 36 |
| S3 | X3 | S3 | F1 | 217 |
| S3 | X3 | S3 | G1 | 249 |
| S3 | Y3 | S0 | F1 | 217 |
| S3 | Y3 | S0 | G1 | 249 |
| S3 | Y3 | S1 | F4 | 2 |
| S3 | Y3 | S1 | G4 | 36 |
| S3 | Y3 | S2 | F1 | 217 |
| S3 | Y3 | S2 | G1 | 249 |
| S3 | Y3 | S3 | F4 | 2 |
| S3 | Y3 | S3 | G4 | 36 |

CLB
300

DEDICATED RESOURCE PLACEMENT ENHANCEMENT

FIELD OF THE INVENTION

The invention relates generally to placement of resources in a localized area of a network, and more particularly to placement of logic blocks in a local area of an integrated circuit for enhancing dedicated routing resources.

BACKGROUND OF THE INVENTION

Programmable logic devices (PLDS) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic devices, called a field programmable gate array (FPGA), is very popular because of a superior combination of capacity, flexibility, time-to-market, and cost. An FPGA typically includes an array of configurable logic blocks (CLBS) surrounded by a ring of programmable input/output blocks (IOBs). The CLBs and IOBs are interconnected by a programmable interconnect structure. The CLBS, IOBS, and interconnect structure are typically programmed by loading a stream of configuration data (bitstream) into internal configuration memory cells that define how the CLBS, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

Referring to FIG. 1, there is shown a schematic diagram of a CLB architecture 10 in accordance with prior art. Other details regarding CLB architecture 10 may be found in U.S. Pat. Nos. 6,262,597, 6,118,298 and 5,889,413. CLB 10 comprises four slices, S0, S1, S2 and S3. Each slice S0, S1, S2 and S3 includes two look-up tables (LUTs), namely, LUTs F0 and G0, F1 and G1, F2 and G2, and F3 and G3, respectively. CLB 10 may be cascaded with other CLBs, where carry data inputs 11 and 12 may be from a previous CLB stage, and carry data outputs 21 and 22 may be provided to a subsequent CLB stage. Clock signals, CLK Ø0 and CLK Ø1, are out-of-phase with respect to one another, and each such clock signal is provided to LUTs F3 and G3, F2 and G2, F1 and G1, and F0 and G0. Each slice S0, S1, S2 and S3 has data inputs and data outputs X and Y, namely, D-INs BX0 and BY0, BX1 and BY1, BX2 and BY2, and BX3 and BY3, respectively, and D-OUTs X0 and Y0, X1 and Y1, X2 and Y2, and X3 and Y3, respectively. Each LUT F3 and G3, F2 and G2, F1 and G1, and F0 and G0 receives a respective set of address signals, namely, either address signals F1, F2, F3 and F4 or address signals G1, G2, G3 and G4.

Conventionally, in configuring an integrated circuit, and in particular a CLB, a placer or packer tool (a well-known software tool for locating components or logic blocks for laying out an integrated circuit design) places two LUTS into specific locations in a slice and places four slices into a CLB defined area with little distinction between these four locations. Accordingly, dedicated connections or "fast connects" were utilized through slice placement rules and practically random placement within a CLB area. By "fast connect" in the context of an FPGA, it is meant a dedicated routing resource or connection allowing a LUT output in a CLB to drive one or more specific LUT inputs within the same CLB. However, as is known, fast connects or other dedicated routing resources exist in integrated circuits other than FPGAs, or even more generally PLDS. Accordingly, it should be appreciated that fast connects are not limited to any particular architecture, and thus exist outside the context of PLDs.

A conventional placer rule for placement of LUTs is if one of two LUTs drives the other of the two LUTs, then such two LUTs are placed at specific locations that allow a fast connect to be used for that connection. Conventionally, locations of LUTs coupled for fast connection remain fixed for a remainder of a placer tool's process flow. A problem emerges due to fixing such placement because not all fast connects will have the same speed. Moreover, placement of slices, and therefore LUTs, within a CLB area is insufficiently controlled to ensure that all fast connects will have optimized speed.

In actuality, speed of fast connects can vary so dramatically that critical connections, connections with difficult to meet timing targets usually with a negative connection slack or just marginally positive connection slack, for a user defined timing path associated with LUTs configured for fast connect can fail to get a "fast" connection. In other words, an attempt to use a fast connect to meet an important delay target for a circuit design programmed into a PLD may not completely be realized as fast connect speed may be insufficient. Speed of fast connects conventionally range from approximately 1 picoseconds (ps) to approximately 300 ps. Non-fast connect speeds conventionally are approximately 380 ps or more.

In instances where a LUT in a slice drove another LUT in another or a same slice, use of fast connects was allowed through LUT input pin swapping, or "pin swapping," provided a fast connect existed for a current LUT placement. A router tool swapped pins during a post-placement routing phase. However, there are instances where pins are not swappable, such as certain LUT configurations, for example when configured as a random access memory or a shift register.

Moreover, though same source address signals may be provided to a "G-" LUT and an "F-" LUT, routing of such address signals may not be equivalent. Thus, propagation delay of each of address signals F1, F2, F3, F4, G1, G2, G3 and G4 may be different within a slice S0, S1, S2 and S3 and between such slices within a CLB.

Accordingly, it would be desirable and useful to improve placement of slices within a CLB area to enhance the number of fast connects available. Accordingly, it would be desirable and useful to rank fast connects according to speed to facilitate utilization of faster fast connects over slower fast connects, and more particularly to facilitate taking into account speed differences of fast connects for addressing design timing constraints.

SUMMARY OF THE INVENTION

An aspect of the invention is a process that facilitates improving or maximizing use of fast connects by changing placement of logic within a CLB. Another aspect of the invention is a means for taking into account speed differences between different fast connects. Additionally, user-timing constraints may be taken into consideration in another aspect of the invention.

An aspect of the invention is a method for improving network performance where a local area of the network is obtained. Generated are signal propagation placement options for dedicated resources of the network within the local area obtained, which are then scored at least partially responsive to respective delay targets. The dedicated resources are then placed responsive to a score of one of the signal propagation placement options.

Another aspect of the invention is a method for improving placement of dedicated resources of a network of circuit blocks. A local area, where the dedicated resources are located, is obtained, and placement options are generated for placing the circuit blocks in the local area. The placement options are scored, where the scoring includes costing the placement options at least partially responsive to delays of the dedicated resources. The circuit blocks are placed in the local area responsive to the placement options costed.

Another aspect of the invention is an integrated circuit having a local area comprising dedicated resources and circuit blocks coupled one to another and positioned for improved dedicated resource usage by: obtaining the local area; generating circuit-block level placement options; scoring the circuit-block level placement options at least partially responsive to delay targets; and placing the circuit blocks responsive to a score of one of the circuit-block level placement options.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE DRAWINGS

In the following description, numerous specific details are set forth to provide a more thorough understanding of the invention. However, it will be apparent to one of skill in the art that the invention may be practiced without one or more of these specific details. In other instances, well-known features have not been described in order to avoid obscuring the invention.

Figure 1:
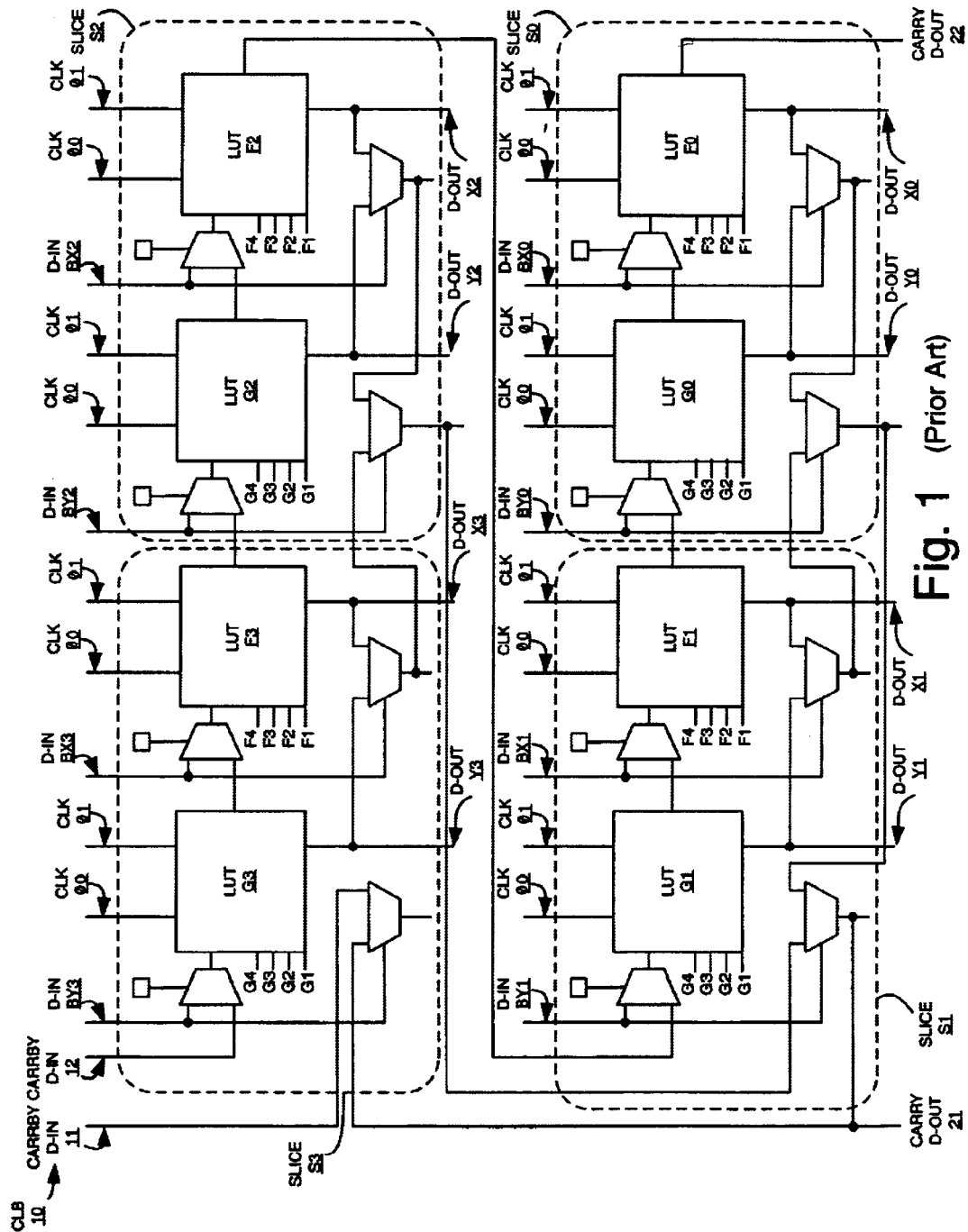
FIG. 1 is a schematic diagram of a CLB architecture for cascading CLBS in accordance with prior art.
Figure 2:
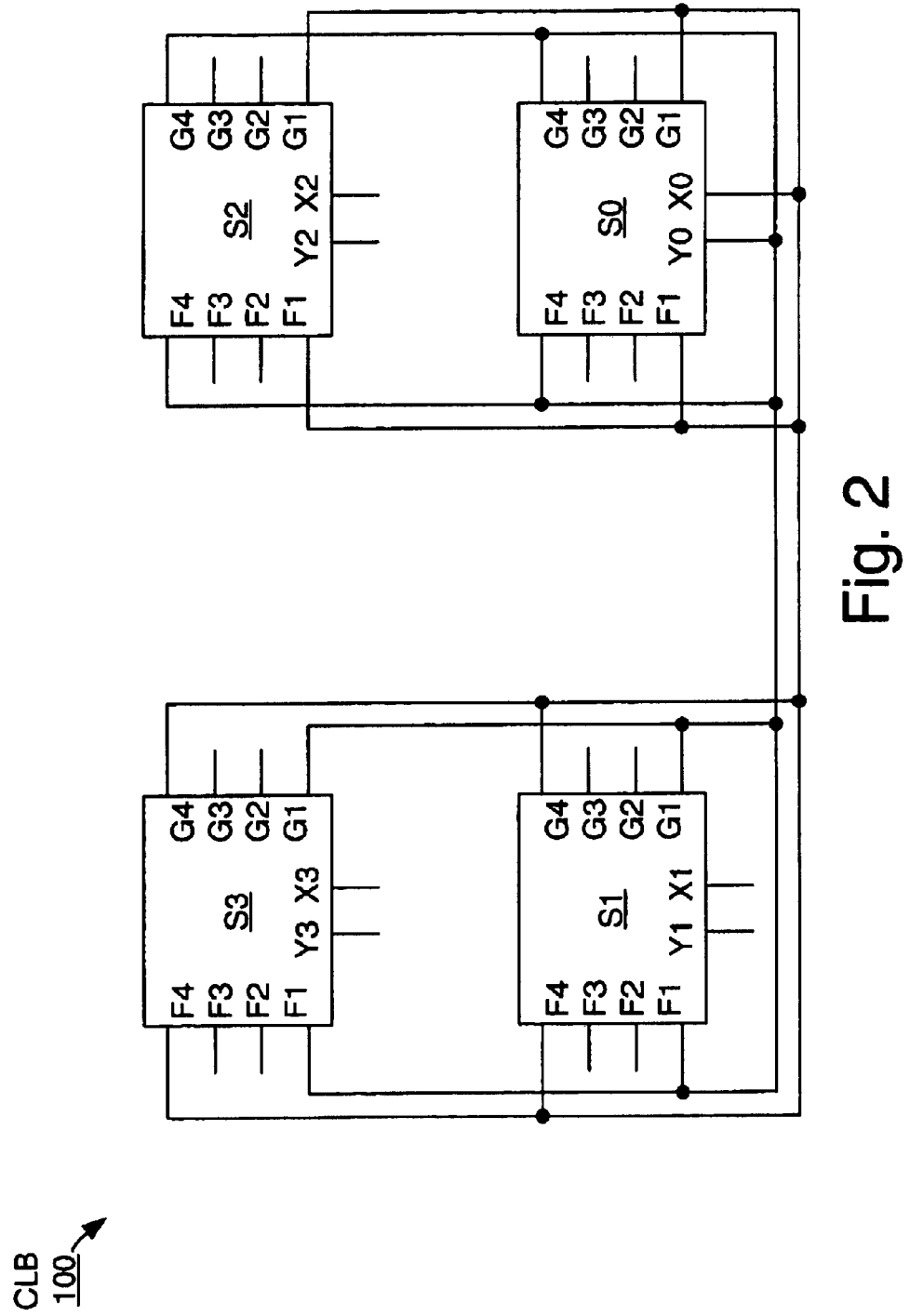
FIG. 2 is a block-level circuit diagram of an exemplary embodiment of a portion of fast connects for a CLB in accordance with one or more aspects of the invention architecture.

FIG. 2 is a block-level circuit diagram of an exemplary embodiment of a portion of fast connects for CLB architecture 100 in accordance with one or more aspects of the invention. CLB architecture 100 has been enhanced as describe below in more detail with respect to placement of slices S0, S1, S2 and S3. For clarity, only fast connects for slice S0 as a driver slice to slices S0, S1, S2 and S3 as load slices have been illustratively shown in FIG. 2. However, it will become apparent that one to all of the slices may be used as a driver slice.

As slice S0 is a driver slice, outputs X0 and Y0 are used to drive load slices S0, S1, S2 and S3. It should be understood in a more granular sense that LUTs of S0 drive LUTs of S0, S1, S2 and S3. Output X0 drives: slices S0 and S2 on pins F1 and G1, and slices S1 and S3 on pins F4 and G4. Output Y0 drives: slices S0 and S2 on pins F4 and G4, and slices S1 and S3 on pins F1 and G1. Notably, all fast connect connects for all slices are not shown in FIG. 2 for purposes of clarity. However, which outputs of which slices drive which pins of other slices may be tabularized, and delays associated with each of these dedicated routing resources for this local area may be added to such a table.

Figure 3A:
FIGS. 3A and 3B is a table diagram of an example of a fast connect delay table for a CLB of the prior art.
Figure 3B:

Table 300 of FIGS. 3A and 3B is an example of a fast connect delay table for a CLB, namely, a CLB of a Spartan® Virtex™-II from Xilinx of San Jose, Calif., having four slices each with two LUTs. Table 300 lists driver slices and output pins for such driver slices. Output from driver slices are provided to input pins of load slices, as listed in table 300. Each output pin to input pin connection has an associated delay. In a CLB area, these delays are fast connect delays. Table 300 lists approximate fast connect delays. Delays in table 300 may be put into one of three groups, namely, slow, medium and fast. Fast delays are in approximately an upper third of fast connect delays, e.g., approximately 0 to 40 ps delay in table 300. Medium delays are in approximately a middle third of fast connect delays, e.g., approximately 150 to 190 ps delay in table 300. Slow delays are in approximately a lower third of fast connect delays, e.g., approximately 210 to 250 ps delay in table 300.

Figure 4:
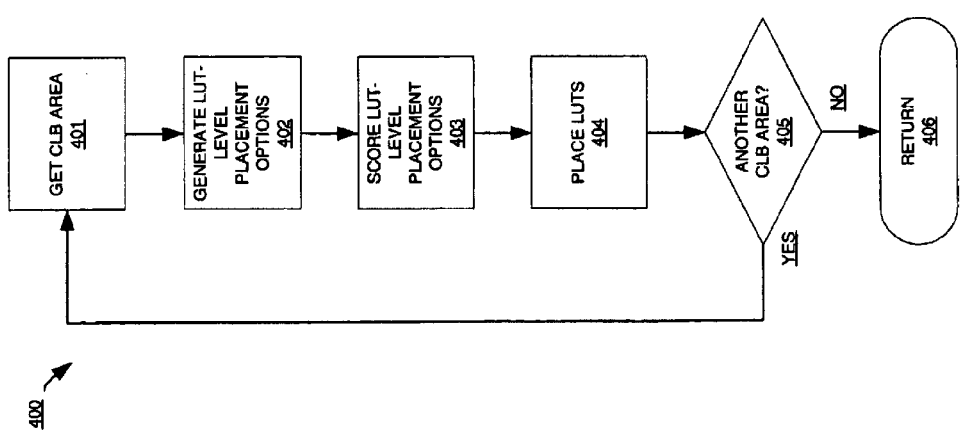
FIG. 4 is a process flow diagram of an exemplary embodiment of a dedicate resource placement routine in accordance with one or more aspects of the invention.

FIG. 4 is a process flow diagram of an exemplary embodiment of a dedicate resource placement routine 400 in accordance with one or more aspects of the invention. At step 401, a CLB area is obtained. At step 402, LUT-level placement options are generated. Continuing the above example, possible locations for locating two LUT within each slice, and therefore possible locations for locating each slice within each CLB, is determined. All possible slice placements within a CLB area may be evaluated. Furthermore, LUT and/or slice swapping may be allowed within a slice and/or CLB area, respectively, in order to improve a score, as described below.

At step 403, LUT-level placements from step 402 are scored for determining a best solution among the possible placements evaluated. Scoring may be as basic as categorizing delays for fast connects for LUT placement into one of three groups, namely, slow, medium and fast as described above. Additionally, values may be ascribed to each group in order to adjust weighting such groups. For example, slow, medium and fast groups may be given respective values of 6, 7 and 8. For example, pairs of LUT with "twconns" (connections with timing constraint) may have a one added to their score for medium and fast group types only. Furthermore, pairs of LUT with twconns that have a negative slack, namely, are not at least meeting a target delay, may have a one added to their score. Accordingly, a placer tool may therefore improve or optimize CLB by selecting a LUT/slice placement having a best score to improve or maximize fast connect usage.

Delays need not be place into the three above-described groups. For example, each delay, for example in table 300 of FIGS. 3A and 3B, may be their own group.

At step 404, LUT placement is done in response to a possible placement evaluated in step 403. This may be a best scoring placement from step 403. At step 405, a check is made for another CLB area needing LUT placement improvement or optimization. If no other CLB needs evaluating, process 400 may continue to a router process having called process 400. Notably, using basic scoring for placement, runtime increase was negligible. Runtime did increase if a resettargets function call, namely, a call to update timing prior to a placement enhancement, was made to a timing engine to update timing. However, this additional runtime will arrive at a better solution.

Other localized optimizations or improvements may be used in addition to LUT swapping. Such other localized optimizations or improvements include, but are not limited to: nearest neighbor swapping for fast connect improvement, and direct connect improvements or optimizations factoring in contention.

Figure 5:
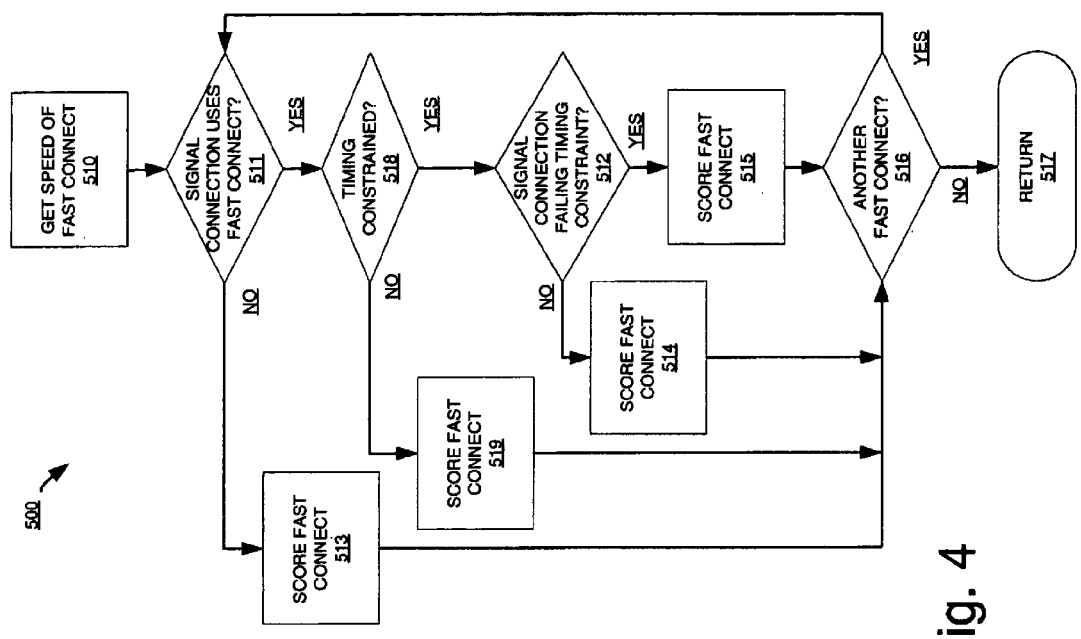
FIG. 5 is a process flow diagram of an exemplary embodiment of a dedicated resource scoring subroutine in accordance with one or more aspects of the invention.

FIG. 5 is a process flow diagram of an exemplary embodiment of a dedicated resource scoring subroutine 500 in accordance with one or more aspects of the invention. Subroutine 500 may be called by process 400 at step 403 to take into account other factors for scoring, including in particular user or design timing constraints.

At step 510, a speed of a fast connect is obtained. This speed is for a fast connect being evaluated at step 403 of FIG. 4. At step 511, it is determined whether a signal connection uses this fast connect being evaluated. This may be done at least in part by checking signal identity as being routed using this fast connect. If no signal is using this fast connect, then at step 513 such a fast connect is scored.

If, however, a signal is using this fast connect, then at step 518 a check is made to determine if this signal using this fast connect is a connection having a timing constraint. Notably, not all connections may have a timing constraint, and thus check 518 is used to sort connections based on whether they do have a timing constraint. If a connection from step 510 does not have a timing constraint as checked at step 518, then such connection is scored at step 519.

If, however, a connection from step 510 does have an associated timing constraint, then a check is made at step 512 to determine if a signal on such a connection is failing its timing constraint, such as it has a negative slack. If such signal is not failing its timing constraint, then this fast connect is scored at step 514. If, however, this signal using this fast connect is failing its timing constraint, it is scored at step 515. Depending on whether scoring takes place at steps 513, 519, 514 or 515 will affect score of such a fast connect. Scoring may be divide into categories dependent on whether a signal uses a fast connect, and, if such a signal uses a fast connect, whether such a signal is failing a time constraint or user design target delay.

At step 516, a check for another fast connect is made at step 516. If there is another fast connect to be evaluated, it is obtained at step 510. If no other fast connect is to be evaluated, namely, all fast connects for a LUT-level placement have been evaluated, then subroutine 500 returns to process 400 at step 517.

Figure 6:
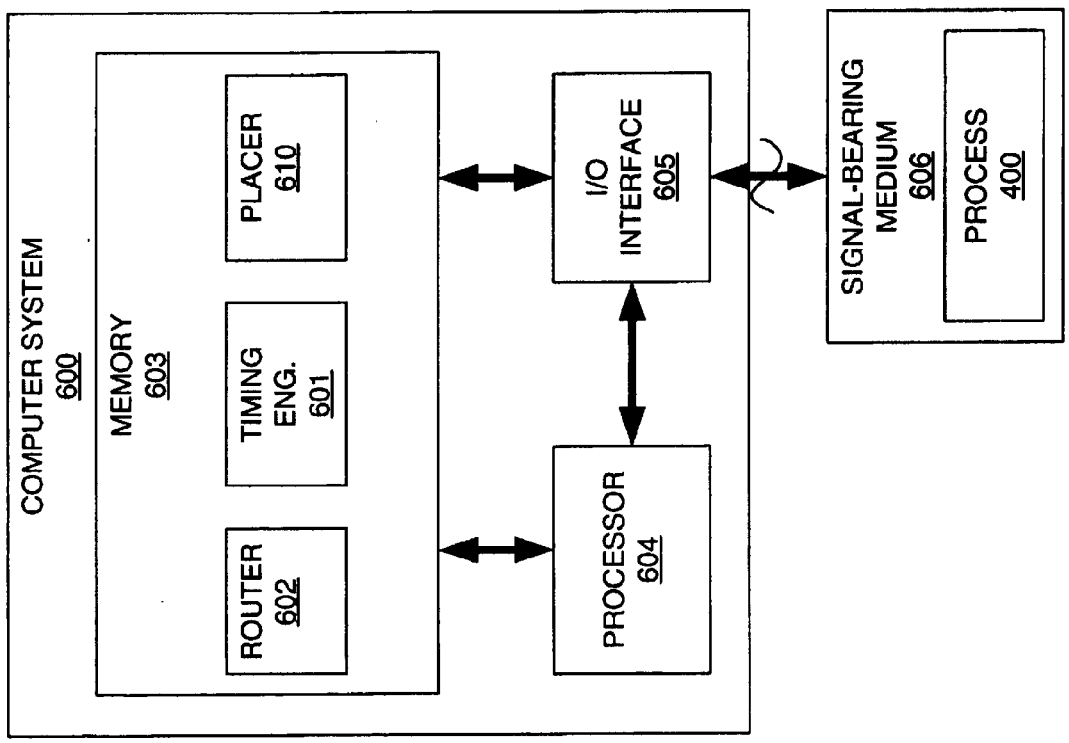
FIG. 6 is a block diagram of an exemplary embodiment of a programmed computer system in accordance with one or more aspects of the invention.

FIG. 6 is a block diagram of an exemplary embodiment of a programmed computer system 600 in accordance with one or more aspects of the invention. Computer system 600 comprises at least one processor 604 coupled to memory 603 and to I/O interface 605. Optionally, I/O interface 605 may be coupled to memory 603 for direct memory addressing. Memory 603 is shown programmed with all or a portion of a router 602, a placer 610 and a timing engine 601. Router 602, placer 610 and timing engine 601 may be put in communication with one another. Instructions for carrying out at least a portion of one or more of processes 400, 500 may be on signal-bearing medium 606 for communication with computer system 600, and in particular placer 610, router 602 or timing engine 601.

One or more aspects of the invention are implemented as one or more program products for use with a computer system such as, for example, computer system 600. The program(s) of the program product defines functions of the one or more aspects and can be contained on a variety of signal-bearing media, such as signal-bearing medium 606, which include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the invention, represent one or more aspects of the invention.

While the foregoing is directed to the preferred embodiment of the invention, other and further embodiments of the invention may be devised without departing from the basic scope thereof, and the scope thereof is determined by the claims that follow. For example, one or more aspects of the invention were described in terms of a CLB architecture of an FPGA for purposes of clarity; however, a CLB architecture is merely one form of a local area, such as a local network or sub-network, of logic blocks, and other forms of local areas may be used in accordance with one or more aspects of the invention. Therefore, it is further understood that architectures, other than FPGAs, may be used. Examples of such other architectures include, but are not limited to, microprocessors, application specific integrated circuits, application specific standard products, digital signal processors, and the like. Furthermore, one or more aspects of the invention were described in terms of fast connects, which are particular FPGAs for purposes of clarity; however, fast connects are merely one form of dedicated routing resources, such as a dedicated driver-to-load interconnect. Therefore, it is further understood that dedicated routing resources, other than fast connects, may be used. Examples of such other dedicated routing resources may be found in microprocessors, application specific integrated circuits, application specific standard products, digital signal processors, and the like, among other integrated circuits.

Use of dedicated resources can free up general purpose routing resources of a network. Accordingly, enhancing usage potential of dedicated resources may improve design performance by making more general-purpose routing resources available. Moreover, it should be appreciated that improving or maximizing use of a dedicated routing resource through localized re-packing of within a region driven in large part by user timing constraints significantly improves performance when such dedicated resources, previously not available for use, are then used.

What is claimed is:

1. A method for improving placement of dedicated resources of a network of circuit blocks, comprising:

getting a local area, wherein the dedicated resources are in the local area;

generating placement options for placing the circuit blocks in the local area;

scoring the placement options, the scoring including costing the placement options at least partially responsive to delays of the dedicated resources, the scoring including determining whether an interconnect of the dedicated resources is used for a signal connection, wherein the dedicated resources are fast connects, and wherein each of the fast connects is scored for a placement option; and placing the circuit blocks in the local area responsive to the placement options costed.

2. The method according to claim 1, further comprising checking for another local area to be improved.

3. The method according to claim 1, wherein the scoring comprises determining whether a signal is failing a delay time target.

4. The method according to claim 3, wherein the scoring is divided into three categories.

5. The method according to claim 1, wherein the delays are grouped into categories for scoring.

6. The method according to claim 1, wherein the delays are individually scored.

7. The method according to claim 1, wherein the local area is a configurable logic block area.

8. The method according to claim 7, wherein the generating comprises swapping slice locations.

9. The method according to claim 1, wherein the circuit blocks are look-up tables.

10. The method according to claim 1, wherein the generating comprises swapping look-up table locations.

11. A signal-bearing medium containing a program which, when executed by a processor, causes execution of a method comprising:

obtaining a local area, wherein dedicated resources are in the local area;

generating placement options for placing the circuit blocks in the local area;

scoring the placement options, the scoring including costing the placement options at least partially responsive to delays of the dedicated resources, the scoring including determining whether an interconnect of the dedicated resources is used for a signal connection, wherein the dedicated resources are fast connects, and wherein each of the fast connects is scored for a placement option; and placing the circuit blocks in the local area responsive to the placement options costed.

12. A signal-bearing medium containing a program which, when executed by a processor, causes execution of a method comprising:

obtaining a local area of a network;

generating signal propagation placement options for dedicated resources within the local area;

scoring the signal propagation placement options at least partially responsive to respective delay targets for signals to be propagated with the dedicated resources, the scoring including determining whether an interconnect of the dedicated resources is used for a signal connection, wherein the dedicated resources are fast connects, and wherein each of the fast connects is scored for a placement option; and placing the dedicated resources responsive to a score of one of the signal propagation placement options.

13. A method for improving network performance, comprising:

obtaining a local area of the network;

generating signal propagation placement options for dedicated resources of the network within the local area obtained;

scoring the signal propagation placement options at least partially responsive to respective delay targets for signals to be propagated with the dedicated resources, the scoring including determining whether an interconnect of the dedicated resources is used for a signal connection, wherein the dedicated resources are fast connects, and wherein each of the fast connects is scored for a placement option; and placing the dedicated resources responsive to a score of one of the signal propagation placement options.

14. The method according to claim 13, wherein the network is an integrated circuit having a logic blocks.

15. The method according to claim 14, wherein the integrated circuit is a programmable logic device.

16. The method according to claim 15, wherein the local area is a configurable logic block area, wherein the dedicated resources are fast connects, and wherein the logic blocks are look-up tables.

* * * * *